United States Patent [19]
Yamazaki et al.

[11] Patent Number: 5,804,471
[45] Date of Patent: Sep. 8, 1998

[54] METHOD OF FABRICATING THIN FILM TRANSISTOR

[75] Inventors: Shunpei Yamazaki, Tokyo; Akira Takenouchi; Yasuhiko Takemura, both of Kanagawa, all of Japan

[73] Assignee: Semiconductor Energy Laboratory Co., Ltd., Kanagawa, Japan

[21] Appl. No.: 657,109

[22] Filed: Jun. 3, 1996

Related U.S. Application Data

[62] Division of Ser. No. 160,909, Dec. 3, 1993, abandoned.

[30] Foreign Application Priority Data

Dec. 4, 1992 [JP] Japan .................................. 4-350546
Nov. 5, 1993 [JP] Japan .................................. 5-301172

[51] Int. Cl.$^6$ .................................................. H01L 21/00
[52] U.S. Cl. ........................ 438/154; 438/164; 438/166; 438/513; 438/530; 438/798; 438/913; 148/DIG. 76; 148/DIG. 90
[58] Field of Search ..................... 438/154, 164, 438/166, 513, 530, 798, 913; 148/DIG. 76, DIG. 90

[56] References Cited

U.S. PATENT DOCUMENTS

| | | |
|---|---|---|
| 4,322,253 | 3/1982 | Pankove et al. . |
| 4,552,595 | 11/1985 | Hoga . |
| 4,576,851 | 3/1986 | Iwamatsu . |
| 4,589,951 | 5/1986 | Kawamura . |
| 4,609,407 | 9/1986 | Masao et al. . |
| 4,663,829 | 5/1987 | Hartman et al. .......................... 437/101 |
| 4,719,123 | 1/1988 | Haku et al. . |
| 4,888,305 | 12/1989 | Yamazaki et al. ....................... 437/101 |
| 4,937,205 | 6/1990 | Nakayama et al. ...................... 437/165 |
| 5,174,881 | 12/1992 | Iwasaki et al. ............................ 118/719 |
| 5,186,718 | 2/1993 | Tepman et al. ............................ 29/25.01 |
| 5,194,398 | 3/1993 | Miyachi et al. ........................... 437/101 |
| 5,200,017 | 4/1993 | Kawasaki et al. ......................... 118/719 |
| 5,292,675 | 3/1994 | Codama ....................................... 437/21 |
| 5,310,410 | 5/1994 | Begin et al. ............................... 118/719 |
| 5,314,538 | 5/1994 | Maeda et al. ............................. 29/25.01 |
| 5,314,839 | 5/1994 | Mizutani et al. . |
| 5,324,360 | 6/1994 | Kozuka ...................................... 118/719 |
| 5,581,092 | 12/1996 | Takemura .................................... 257/65 |
| 5,595,638 | 1/1997 | Konuma et al. ............................ 205/96 |
| 5,608,232 | 3/1997 | Yamazaki et al. .......................... 257/66 |
| 5,608,251 | 3/1997 | Konuma et al. ........................... 257/337 |
| 5,620,905 | 4/1997 | Konuma et al. ........................... 438/163 |
| 5,639,698 | 6/1997 | Yamazaki et al. ......................... 438/486 |

*Primary Examiner*—John Niebling
*Assistant Examiner*—Long Pham
*Attorney, Agent, or Firm*—Sixbey, Friedman, Leedom & Ferguson, P.C.; Gerald J. Ferguson, Jr.

[57] ABSTRACT

A multi-chamber system for providing a process of a high degree of cleanliness in fabricating semiconductor devices such as semiconductor integrated circuits. The system comprises a plurality of vacuum apparatus (e.g., a film formation apparatus, an etching apparatus, a thermal processing apparatus, and a preliminary chamber) for fabrication of semiconductor devices. At least one of these vacuum apparatuses is a laser.

13 Claims, 5 Drawing Sheets

METHOD OF FABRICATING THIN FILM TRANSISTOR

This is a Divisional application of Ser. No. 08/160,909, filed Dec. 3, 1993 now abandoned.

FIELD OF THE INVENTION

The present invention relates to a method and apparatus for fabricating semiconductor devices such as various transistors and integrated circuits.

BACKGROUND OF THE INVENTION

In recent years, methods and apparatus which use lasers to manufacture semiconductor devices have been developed. Examples of these methods and apparatus include laser etching, or laser scribing, in which films are etched and patterned, laser annealing in which the crystalline state of films or their surfaces are changed by laser irradiation, and laser doping in which an impurity is diffused into films or their surfaces by laser irradiation within an ambient containing the impurity.

In these conventional semiconductor fabrication methods using lasers, a substrate already processed by other film formation apparatus or etching apparatus is first placed in position inside a laser processing apparatus. The inside of this apparatus is evacuated and the substrate is heated and then the substrate is processed by laser radiation. Consequently, the productivity is very low.

SUMMARY OF THE INVENTION

It is an object of the present invention to provide a method of fabricating semiconductor devices with improved productivity.

It is another object of the invention to provide an apparatus capable of fabricating semiconductor devices with improved productivity.

An apparatus according to the present invention comprises a multi-chamber system consisting of a film formation apparatus (e.g., a plasma CVD apparatus, a sputtering apparatus, a thermal CVD apparatus, or a vacuum evaporation apparatus), an etching apparatus, a doping apparatus (e.g., a plasma doping apparatus or an ion implanter), a thermal processing apparatus (e.g., a thermal diffusion apparatus or a thermal crystallization apparatus), a vacuum apparatus such as a preliminary chamber, and a laser processing apparatus (e.g., a laser etching apparatus, a laser annealing apparatus, or a laser doping apparatus). The novel apparatus performs processing without exposing each substrate to the atmosphere at all. In this system, the evacuation can be effected in a greatly shortened time. In addition, when the substrate is transported, it is protected from contamination.

Also, various annealing methods making use of infrared light irradiation rather than laser irradiation are available. For example, an amorphous silicon film formed on a glass substrate is crystallized by heating and then irradiated with infrared radiation. As a result, the crystallinity can be enhanced further. Infrared radiation is absorbed more readily by the thin silicon film than by the glass substrate. Only the thin silicon film can be heated without heating the glass substrate very much. This is advantageous. Furthermore, it is considered that the obtained effect is comparable to the effect produced by a thermal anneal conducted above 1000° C.

An anneal using such irradiation of infrared radiation can be completed within several minutes. Therefore, this is known as a rapid thermal anneal (RTA). This anneal can be advantageously conducted after an insulating film is formed on a semiconductor layer. In this case, the level in the interface between the semiconductor layer and the insulating film can be reduced, so that the interface characteristics can be enhanced. For example, after an active layer (in which a channel formation layer is formed) for an insulated-gate field-effect transistor is formed, a silicon oxide film becoming a gate-insulating film is formed. Subsequently, a rapid thermal anneal process is carried out. In this way, the characteristics at and around the interface between the channel and the gate-insulating film which are an important factor for the insulated-gate field-effect transistor can be improved.

Other objects and features of the invention will appear in the course of the description thereof, which follows.

DETAILED DESCRIPTION OF THE INVENTION

EXAMPLE 1

Figure 1:
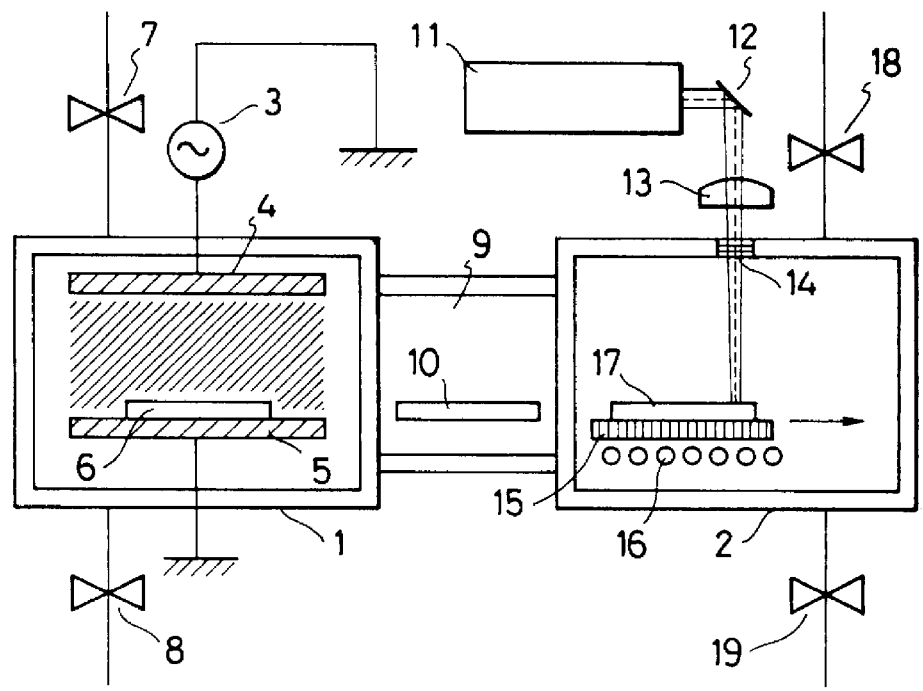
FIG. 1 is a conceptual diagram of a multi-chamber system according to the present invention.

Referring to FIG. 1, there is shown a multi-chamber system according to the invention. This multi-chamber system comprises a plasma CVD film formation apparatus and a laser processing apparatus (e.g., a laser annealing apparatus). A preliminary chamber is formed between these two apparatuses. The plasma CVD apparatus has a chamber 1 equipped with a gas intake valve 7 and an exhaust valve 8. The laser annealing apparatus has a chamber 2 equipped with a gas intake valve 18 and an exhaust valve 19. These valves permit requisite gases to go into and out of these chambers. Also, these valves make it possible to maintain the pressure inside each chamber at an appropriate value.

The chamber 1 is further equipped with electrodes 4 and 5. A substrate or sample 6 to be processed is placed on the electrode 5. An RF power supply 3 of frequency, for example, of 13.56 MHz is connected with the electrode 4. An adequate gas such as monosilane or disilane is admitted into the chamber to induce electric discharge between the electrodes. In this way, a film is formed on the substrate 6. If necessary, the substrate may be heated. Where monosilane is used as the above-described gas and the substrate is maintained below 300° C, an amorphous silicon film is formed on the substrate.

Since such amorphous silicon film does not have excellent electrical characteristics, the silicon is crystallized by laser annealing to improve the characteristics. The chamber 2 is provided with a window 14. Laser light emitted from a laser 11 passes through the window 14 via a mirror 12 and a lens 13 and impinges on a substrate 17 that is placed on a sample holder 15. The substrate 17 is heated to 300°–500° C., preferably 300°–400° C., by a heater 16. This heating operation is indispensable to the process where crystallization is effected with high reproducibility.

The sample holder 15 is capable of moving gradually to the right as viewed in the figure while carrying the substrate 17. As a result, the whole surface of the substrate can be processed by the laser light. Let us assume that the substrate measures 300 mm by 400 mm. The whole surface of the substrate can be treated with the laser light by shaping the cross section of the laser beam into a rectangular form measuring 2 mm×350 mm. If the holder moves at a speed of 20 mm/sec, the time taken to process one substrate is 400/20=20 seconds.

A substrate on which an amorphous silicon film is formed by the plasma CVD apparatus 1 is transported into the laser processing apparatus 2 in the sequence described below. After the formation of the film, the inside of the film formation apparatus 1 is evacuated to a sufficiently high vacuum. Also, the preliminary chamber, indicated by 9, is evacuated to a sufficiently high vacuum. A gate mounted between the film formation chamber 1 and the preliminary chamber is opened, followed by shift of the substrate into the preliminary chamber. Thereafter, the gate is closed. A reactive gas is again introduced into the film formation apparatus to start growth of a film.

At this time, the inside of the laser processing apparatus 2 is evacuated to a sufficiently high vacuum. The inside of the preliminary chamber 9 has been already maintained as a sufficiently high vacuum. The gate between the preliminary chamber and the laser processing apparatus is opened, and then the substrate is transported from the preliminary chamber into the laser processing apparatus. Subsequently, the gate is closed. The sample holder 15 is heated to an appropriate temperature by the heater 16. After the temperature has stabilized and the substrate set in the laser processing apparatus has been accurately aligned, laser processing is carried out.

At this time, if the time required for the laser processing apparatus to process one substrate (including operations for placing the substrate in position, aligning, and taking out the substrate) is substantially equal to the time required for the plasma CVD apparatus to form a film (including operations for placing the substrate in position and evacuating the inside), then no waiting time is necessary between the processing performed by the plasma CVD apparatus and the processing conducted by the laser processing apparatus. If the time taken to process one substrate by laser light is half of the time taken to form a film by the plasma CVD apparatus, then the film may be formed on two substrates in one operation by the plasma CVD apparatus. In this case, after completion of the film, the two substrates are moved into the preliminary chamber. One of them is transported into the laser processing apparatus where the substrate is processed. The other is preserved in the preliminary chamber. After the first one is processed, the one preserved in the preliminary chamber is processed.

EXAMPLE 2

Figure 2:
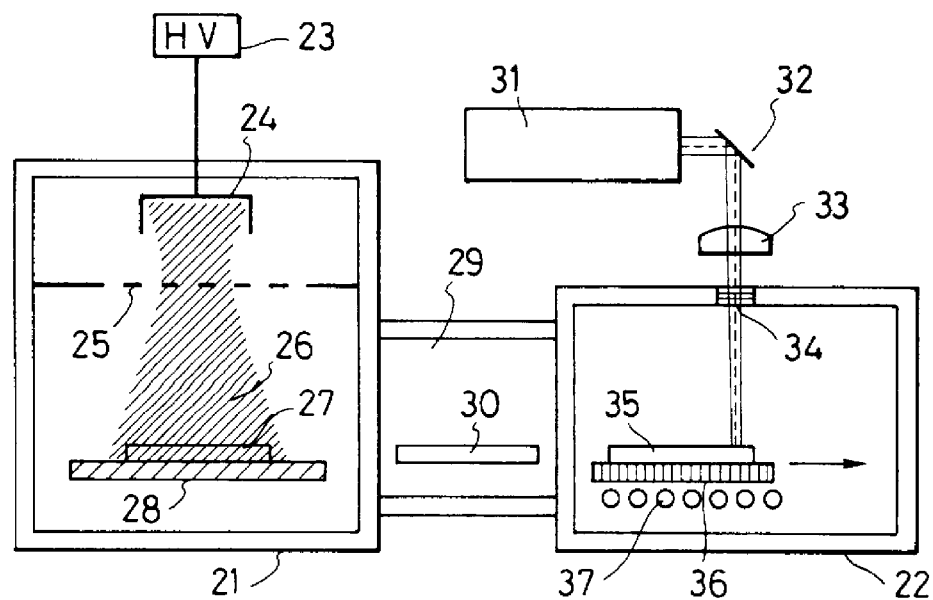
FIG. 2 is a conceptual diagram of another multi-chamber system according to the present invention.

Referring to FIG. 2, there is shown another multi-chamber system according to the invention. This system comprises a combination of a plasma doping apparatus) and a laser processing apparatus (e.g., a laser annealing apparatus). A preliminary chamber is formed between these two apparatuses.

The plasma doping apparatus and the laser annealing apparatus have chambers 21 and 22, respectively. These chambers are designed so that requisite gases can be introduced into them and that unwanted gases can be expelled from them. Also, the pressure inside each chamber can be maintained at an appropriate value.

The chamber 21 is further equipped with an anode electrode 24 and a grid electrode 25. A high voltage which can be increased up to 100 kV is applied to the anode from a high voltage source 23. A plasma is produced around the grid electrode by RF discharge and contains positive ions 26. These ions 26 are accelerated toward a sample holder 28 by the high voltage described above. As a result, accelerated positive ions are implanted into a substrate or sample 27 lying on the sample holder 28.

This ion implantation changes the state of the crystalline material such as a single crystal of silicon or crystalline silicon formed on the substrate into an amorphous or almost amorphous state. In consequence, the electrical characteristics are deteriorated. Therefore, the substrate is crystallized by laser annealing to improve the characteristics. The chamber 22 is provided with a window 34. Laser light emitted from a laser 31 passes through the window 34 via a mirror 32 and a lens 33 and impinges on a substrate 35 that is placed on a sample holder 36. The substrate may be heated by a heater 37. The sample holder is capable of moving gradually to the right as viewed in the figure while carrying the substrate. As a result, the whole surface of the substrate can be processed by the laser light. The substrate doped by the plasma doping apparatus 21 is moved into the laser processing apparatus 22 via the preliminary chamber 29, in the same way as in Example 1.

In the present example, the doping apparatus makes use of ion implantation which uses a plasma source. Obviously, the doping apparatus can be replaced by an ion implanter which separates ions according to their masses and implants them into the substrate.

EXAMPLE 3

Figure 3:
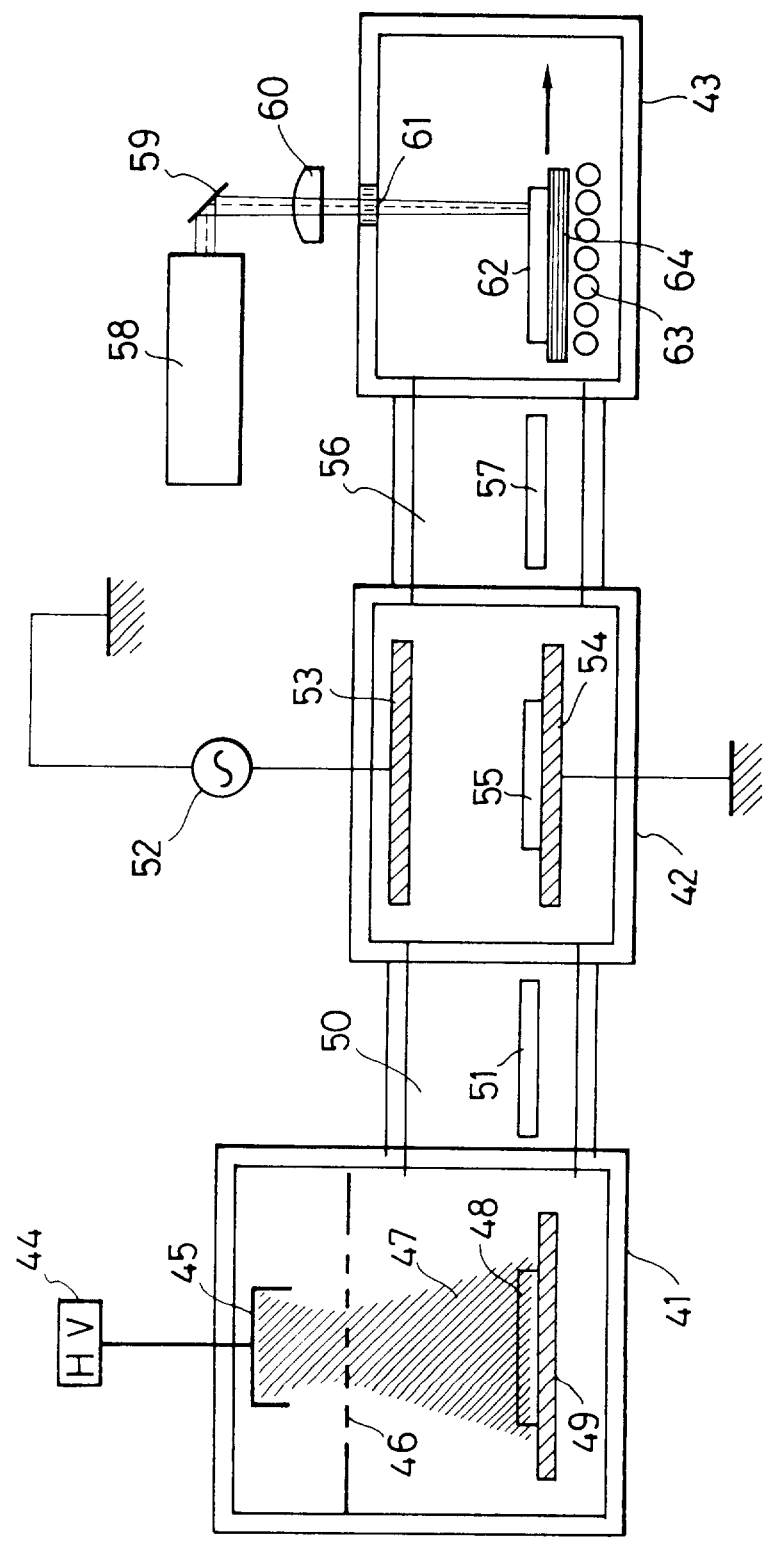
FIG. 3 is a conceptual diagram of a further multi-chamber system according to the present invention.

Referring next to FIG. 3, there is shown a further multi-chamber system according to the invention. This system comprises a combination of a plasma doping apparatus, a dry etching apparatus, and a laser processing apparatus (e.g., a laser annealing apparatus). A preliminary chamber is formed between any adjacent ones of these three apparatuses.

The plasma doping apparatus, the etching apparatus, and the laser annealing apparatus have chambers 41, 42, and 43, respectively. These chambers are designed so that requisite gases can be introduced into them and that unwanted gases can be discharged from them. Also, the pressure inside each chamber can be maintained at an appropriate value.

The chamber 41 is further equipped with an anode electrode 45 and a grid electrode 46. A high voltage which can be increased up to 100 kV is applied to the anode from a high voltage source 44. A plasma is produced around the grid electrode by RF discharge and contains positive ions 47. These ions 47 are accelerated toward a sample holder 49 by the high voltage described above. As a result, accelerated positive ions such as boron ions or phosphorus ions are implanted into the substrate or sample 48 lying on the sample holder 49.

For example, it is assumed that a layer of crystalline silicon is formed on the insulating substrate 48 and that a layer of silicon oxide is formed on the layer of crystalline silicon. Also, it is assumed that gate electrodes of thin-film transistors are formed. Desired impurities are implanted into the silicon oxide layer and the silicon layer by this doping method. This method is adequate to form semiconductor devices with high production yield because the doping is carried out through the material such as silicon oxide.

As already described in Example 2, this ion implantation deteriorates the crystallinity and hence the crystallinity is improved by laser annealing or other method. An impurity is also injected into the silicon oxide. Where a UV excimer laser adapted for mass production such as a KrF laser emitting a wavelength of 248 nm, an XeCl laser emitting a wavelength of 308 nm, or an XeF laser emitting a wavelength of 350 nm is used for the laser annealing, a problem takes place. In particular, pure silicon oxide is transparent to UV light of wavelengths exceeding 200 nm but silicon oxide containing impurities absorbs such UV light to a considerable extent. As a result, a major part of the laser energy is absorbed by the silicon oxide film. This makes it impossible to use the laser energy efficiently in improving the crystallinity. To solve this problem, the silicon oxide film is etched so that laser radiation may be efficiently absorbed by the film whose crystallinity should be improved. The etching apparatus 42 is provided for this purpose.

The etching apparatus 42 is equipped with electrodes 53 and 54. An RF power supply 52 is connected with the electrode 53. A substrate 55 is placed on the electrode 54. As an example, if an electric discharge is produced between the electrodes by electric power from the RF power supply within an ambient of carbon tetrafluoride, then the silicon oxide film on the substrate can be etched.

The laser processing apparatus 43 is substantially the same as the laser processing apparatus described in Examples 1 and 2. The chamber 43 is provided with a window 61. Laser light emitted from a laser 58 passes through the window 61 via a mirror 59 and a lens 60 and impinges on a substrate 62 lying on a movable sample holder 64. The substrate may be heated by a heater 63.

The substrate doped by the plasma doping apparatus 21 is transported into the etching apparatus 42 via a preliminary chamber 50 in the same way as in Example 1. After end of etching processing, the substrate is moved into the laser processing apparatus 43 via the preliminary chamber 56.

An example of fabrication of thin-film transistors (TFTs), using such a multi-chamber system, is described by referring to FIG. 5, (A)–(F). A silicon oxide film 102 forming a base layer and having a thickness of 20 to 200 nm is formed on a glass substrate 101 made of Corning 7059 by sputtering or plasma CVD. Then, amorphous silicon is deposited as a 100–200 nm-thick-film by LPCVD, plasma CVD, sputtering, or other similar method. The laminate is heated to 550°–650° C. for 4 to 48 hours within an ambient of nitrogen or in a vacuum to crystallize the amorphous silicon film.

The crystallized silicon film is patterned into N-type regions 103 and P-type regions 104. A silicon oxide film 105 having a thickness of 50 to 150 nm and acting as a gate oxide film is formed. Then, gate electrodes 106 and 107 are fabricated from aluminum, tantalum, chromium, tungsten, molybdenum, silicon, an alloy of some of them, or the material of multilayer conductive interconnects (FIG. 5(A)).

Then, a masking material 108 such as a photoresist is formed only on the N-type regions 103. Boron ions are implanted by the plasma doping apparatus 41 shown in FIG. 3. The boron ions are accelerated at an accelerating voltage of 20 to 65 keV, typically 65 keV. The dose is $6\times10^{15}$ atoms/cm$^2$. P-type regions 109 are formed by this doping process (FIG. 5(B)).

After the end of the doping process, the substrate is conveyed into the etching apparatus 42, where the masking material 108 is removed by electric discharge within an ambient of oxygen. Usually, a high efficiency would be obtained by peeling the masking material such as a photoresist with a peeling liquid. However, where moving the substrate into and out of a vacuum apparatus is taken into account, ashing by the etching apparatus will give a high efficiency to the multi-chamber system shown in FIG. 3. Also, a high throughput will be derived.

The substrate is returned to the doping apparatus 41, where phosphorus atoms are implanted. The phosphorus atoms are accelerated at an accelerating voltage of 20 to 85 keV, typically 80 keV. The dose is $4\times10^{15}$ atoms/cm$^2$. N-type regions 110 are formed by this doping process (FIG. 5(C)).

Then, the substrate is again transported into the etching apparatus 42, where the silicon oxide film 105 is etched. As described previously, large amounts of phosphorous and boron are contained in the silicon oxide film. Laser light is strongly absorbed by the silicon oxide film. This makes it impossible to conduct laser annealing efficiently (FIG. 5(D)).

After the silicon oxide film 105 is etched, the substrate is transported into the laser processing apparatus 43, where laser annealing is conducted. A KrF laser emitting laser radiation having a pulse width of 20 nsec and a repetition frequency of 200 Hz is used for the laser annealing. Obviously, other kind of laser can also be employed. The energy density per pulse of laser beam is 200 to 400 mJ/cm$^2$, preferably 250 to 300 mJ/cm$^2$. This energy density is modified according to other conditions such as the dose and the thickness of the silicon film (FIG. 5(E)).

After completion of the laser annealing, the substrate is taken out, and an interlayer insulating film 111 and metal interconnects-and-electrodes 112 are formed. Of course, a film formation chamber may be added to the multi-chamber system of FIG. 3 to form the interlayer insulating film continuously. By carrying out these steps, N-channel and P-channel TFTs are formed.

Figure 4:
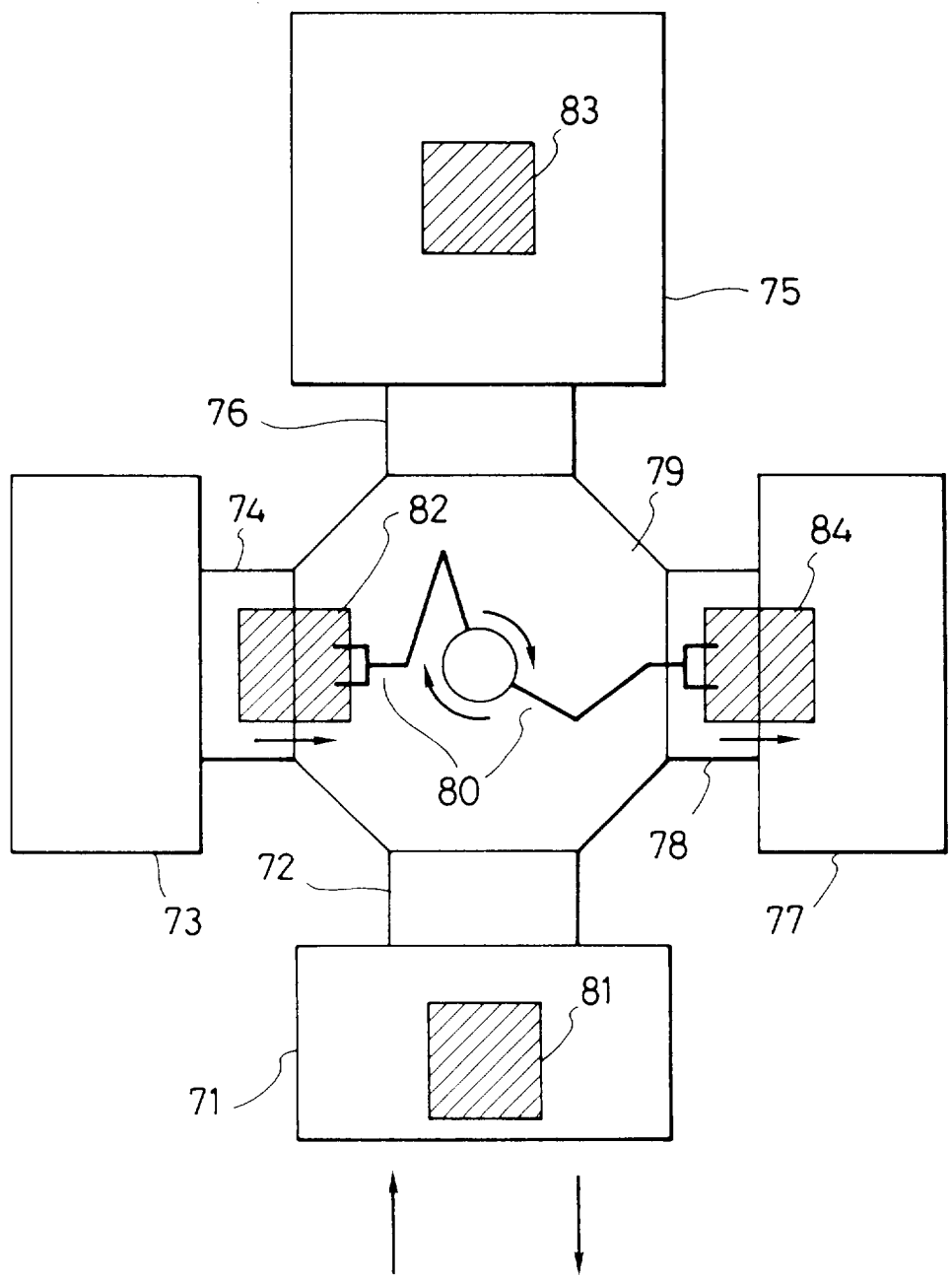
FIG. 4 is a conceptual diagram of a still other multi-chamber system according to the present invention.
Figure 5A:
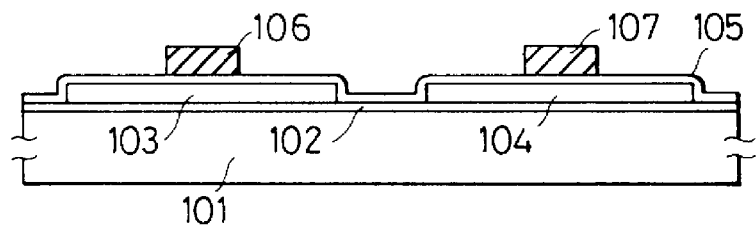
Figs. 5(A)–5(F) are cross-sectional views illustrating a series of operations successively performed to fabricate semiconductor devices according to the invention.
Figure 5B:
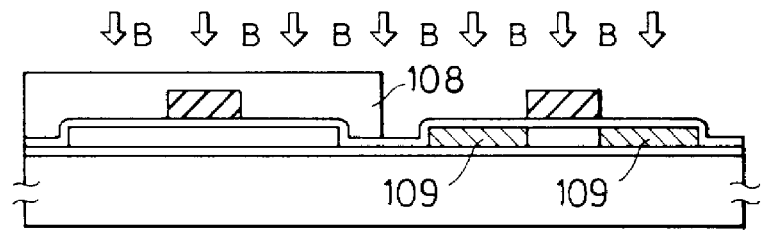
Figure 5C:
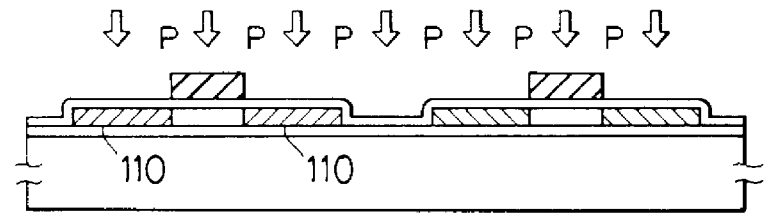
Figure 5D:
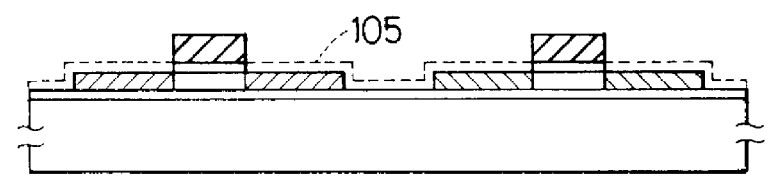
Figure 5E:
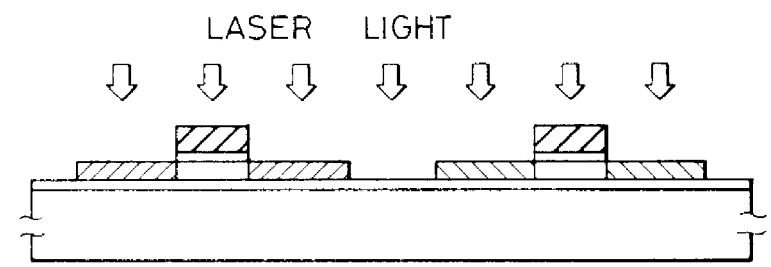
Figure 5F:
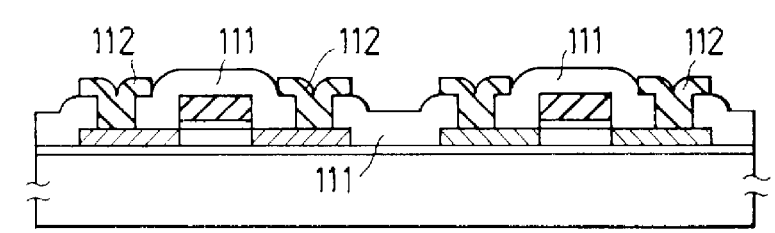

In FIG. 3, the various vacuum apparatus are shown to be connected in series. For example, the vacuum apparatus may be connected in parallel as shown in FIG. 4, where a chamber 71 for introduction and takeout of substrates, a laser processing apparatus 73, a plasma doping apparatus 75, and an etching apparatus 77 are connected with a common preliminary chamber 79 via gates 72, 74, 76, 78, respectively.

Substrates 81–84 are transported into the preliminary chamber and other chamber by a magic hand 80. This system can be expanded as the need arises. During mass production, flexibility (e.g., capability of adding a film formation step and an etching step and flexibility given to modification of tact arising from elongation of the film formation time) can be enhanced.

EXAMPLE 4

Figure 6:
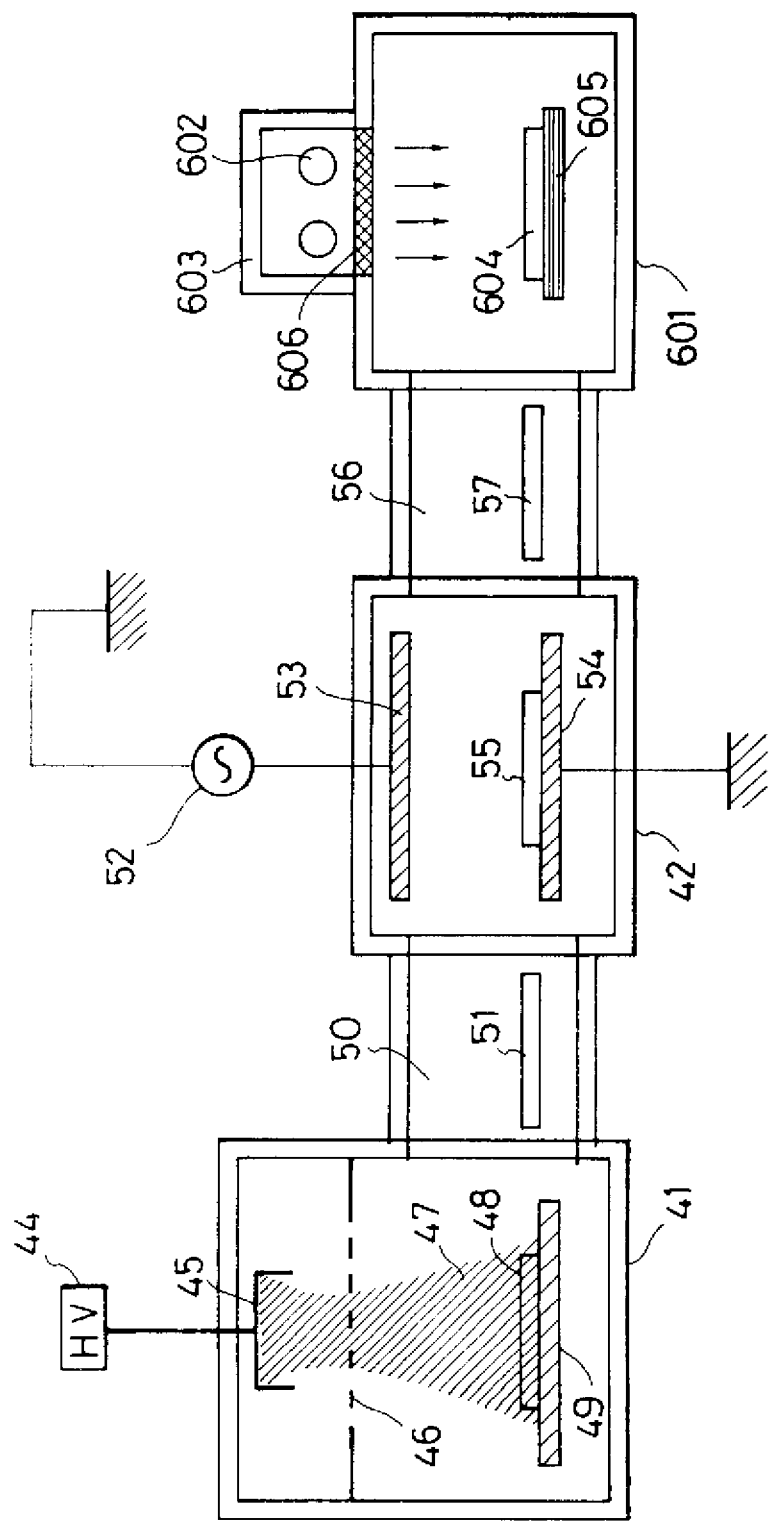
Fig. 6 is a conceptual diagram of a yet other multi-chamber system according to the invention.

Referring to FIG. 6, a plasma doping apparatus has a chamber 41. An etching apparatus has a chamber 42. A rapid thermal anneal (RTA) using infrared radiation is conducted within a chamber 601. The chamber 41 is connected with the chamber 42 by a preliminary chamber 50. The chamber 42 is connected with the chamber 601 by a preliminary chamber 56. It is to be noted that like components are indicated by like reference numerals in both FIGS. 3 and 6.

The chamber 601 for conducting a rapid thermal anneal comprises a light source or lamp 602 emitting infrared light, the chamber 603 forming a light source chamber, and a quartz window 606 transmitting infrared light. The chamber 601 is further provided with a gas intake system (not shown) for introducing inert gas and requisite gases and also with a gas exhaust system (not shown).

A substrate 604 is placed on a substrate holder 605 and transported into the various chambers by a magic hand, or a robot hand for transporting substrates. The substrate may be transported alone or together with the substrate holder.

It is common practice to conduct a rapid thermal anneal within an ambient of an inert gas such as nitrogen. Alternatively, the anneal may be carried out within an ambient of ammonia ($NH_3$), nitrous oxide ($N_2O$), or oxygen.

An example using an apparatus shown in FIG. 6 is described now. FIG. 5 illustrates the sequence of steps for fabricating TFTS. We now consider a situation in which only the right TFT is manufactured. In this case, a silicon oxide film is formed on the active layer 104. Then, the substrate is conveyed into the chamber 601, where a rapid thermal anneal is to be carried out. The inside of the chamber 601 is filled with an inert gas and illuminated with infrared light emitted from the lamp 602. This step improves the characteristics of the interface between the active layer 103 and the silicon oxide film 105. Specifically, the interface level at the interface between the channel formation region and the gate-insulating film can be reduced.

The inside of the chamber 601 is evacuated. The substrate is transported into the preliminary chamber 56 the inside of which is maintained substantially at the same subatmospheric pressure as the pressure inside the chamber 601. The substrate is conveyed into the chamber 41, where a plasma doping process is effected, via the chamber 42 and the preliminary chamber 50 which are similarly maintained at subatmospheric pressure. It is important that these steps for conveying the substrate be carried out without exposing the substrate to outside air.

A required ion implantation step is performed inside the chamber of the doping apparatus. The substrate is then moved into the chamber 42 of the etching apparatus while maintaining the degree of vacuum. A dry etching process is carried out to remove the exposed oxide film 105. The substrate is transported into the chamber 601, where a rapid thermal anreal is effected to activate the implanted impurity. At this time, the absence of the oxide film 105 is important for efficient achievement of the rapid thermal anneal. In particular, the impurity lodged at the time of the ion implantation exists inside the silicon oxide film 105, and this impurity absorbs infrared light.

The structure of the apparatus described thus far may be replaced by a combination of a chamber for illuminating laser radiation and a chamber where a rapid thermal anneal is conducted. Furthermore, a plurality of chambers required may be combined.

In the present invention, a laser processing apparatus is combined with associated vacuum apparatus such as a film formation apparatus and an etching apparatus to form a system. This system is efficiently utilized to provide improved productivity. In this way, the invention is industrially advantageous.

What is claimed is:

1. A method of manufacturing a thin film transistor comprising the steps of:

forming a semiconductor layer over a substrate;

introducing ions of an impurity to selected portions of said semiconductor layer; and performing a rapid thermal annealing on said semiconductor layer after introduction of said ions.

2. A method of manufacturing a thin film transistor comprising the steps of:

placing a substrate having a semiconductor layer formed thereover in a vacuum chamber;

introducing a dopant gas into said vacuum chamber;

applying an electrical energy to said dopant gas in order to form dopant ions;

directing said dopant ions toward said substrate by a voltage by ion implantation which uses a plasma source in order to introduce said ions into portions of said semiconductor layer; and performing a rapid thermal annealing on said semiconductor layer after introduction of said ions.

3. A method of manufacturing a thin film transistor comprising the steps:

placing a substrate having a semiconductor layer formed thereover in a plasma doping chamber;

introducing ions of an impurity to selected portions of said semiconductor layer by plasma doping in said plasma doping chamber;

transferring said substrate to an annealing chamber from said plasma doping chamber;

performing a rapid thermal annealing on said semiconductor layer in said annealing chamber.

4. A method of manufacturing a thin film transistor comprising the steps of:

forming an insulating film including a gate insulator on a semiconductor layer formed over a substrate;

forming a gate electrode on said gate insulator;

introducing ions of an impurity to said semiconductor layer with said gate electrode used as a mask; and performing a rapid thermal annealing on said semiconductor layer to activate said impurity.

5. A method of manufacturing a thin film transistor comprising the steps of:

forming an insulating film including a gate insulator on a semiconductor layer formed over a substrate;

forming a gate electrode on said gate insulator;

introducing ions of an impurity to said semiconductor layer with said gate electrode used as a mask; and performing an annealing with an infra red light on said semiconductor layer to activate said impurity.

6. A method of manufacturing an electronic device comprising the following sequential steps of:

(a) forming at least first and second semiconductor islands over a substrate, each of said first and second semiconductor islands having a gate insulating layer and a gate electrode formed thereon;

(b) introducing only the first semiconductor islands with ions of boron with the associated gate electrode used as a mask while covering the second semiconductor island with a resist mask;

(c) removing said resist mask by ashing;

(d) introducing both the first and second semiconductor islands with ions of phosphorous with the associated gate electrodes used as masks; and (e) rapid thermal annealing said first and second semiconductor islands.

7. The method of claim 6 where said semiconductor layer is formed by LPCVD or plasma CVD.

8. The method of claim 6 wherein said gate electrode comprises a material selected form the group consisting of aluminum, tantalum, chromium, tungsten, molybdenum, silicon, and an alloy thereof.

9. The method of claim 1 wherein said introducing step is carried out by making said ions plasma using an anode electrode and a grid electrode, and accelerating said ions made plasma toward said semiconductor layer.

10. The method of claim 2 wherein said directing step is carried out by making said dopant ions plasma using an anode electrode and a grid electrode, and accelerating said dopant ions made plasma toward said semiconductor layer.

11. The method of claim 3 wherein said introducing step is carried out by making said ions plasma using an anode electrode and a grid electrode and accelerating said ions made plasma toward said semiconductor layer.

12. The method of claim 4 wherein said introducing step is carried out by making said ions plasma using an anode electrode and a grid electrode, and accelerating said ions made plasma toward said semiconductor layer.

13. The method of claim 5 wherein said introducing step is carried out by making said ions plasma using an anode electrode and a grid electrode, and accelerating said ions made plasma toward said semiconductor layer.

* * * * *